(12) United States Patent
Chass

(10) Patent No.: US 6,288,535 B1
(45) Date of Patent: Sep. 11, 2001

(54) HALL EFFECT, SHAFT ANGULAR POSITION SENSOR WITH ASYMMETRICAL ROTOR

(76) Inventor: Jacob Chass, 70-25 Yellowstone Blvd., Forest Hills, NY (US) 11375

( * ) Notice: Subject to any disclaimer, the term of this patent is extended or adjusted under 35 U.S.C. 154(b) by 0 days.

(21) Appl. No.: 09/347,913

(22) Filed: Jul. 6, 1999

(51) Int. Cl.[7] .............................. G01B 7/30; G01R 33/07
(52) U.S. Cl. .................................. 324/207.2; 324/207.25
(58) Field of Search .................................... 324/173, 174, 324/207.15–207.22, 207.25, 232, 235, 240, 242, 251; 73/DIG. 3; 310/68 B, DIG. 3; 340/686.3, 870.32, 870.33, 870.35

(56) References Cited

U.S. PATENT DOCUMENTS

| | | | |
|---|---|---|---|
| 2,124,579 | * 7/1938 | Knerr et al. | 324/242 X |
| 4,652,823 | * 3/1987 | Sutton | 324/240 |
| 5,257,014 | * 10/1993 | Zimmermann | 324/207.22 X |
| 5,521,495 | * 5/1996 | Takahashi et al. | 324/207.18 |
| 5,914,595 | * 6/1999 | Piriou et al. | 324/240 X |

FOREIGN PATENT DOCUMENTS

1023375 * 6/1983 (SU) ............................... 324/207.17

* cited by examiner

Primary Examiner—Gerard R. Strecker
(74) Attorney, Agent, or Firm—Pitney, Hardin, Kipp & Szuch LLP (57) ABSTRACT

A shaft angular position sensor having a DC output voltage has a magnetic housing into which are mounted a Hall effect device, a bobbin-winding assembly and a rotor. The bobbin-winding assembly is a hollow cylindrical coil form made of non-magnetic material about which are wound two excitation coils connected in series opposition. An elongated magnetic core is disposed for rotation within the hollow bobbin. The core is an axial section of a magnetic cylinder which serves to direct two opposing DC magnetic flux flows through the Hall effect device. The output voltage generated by the Hall effect device is indicative of the angular position of the magnetic core relative to the bobbin winding assembly when a DC voltage is applied to the coils.

17 Claims, 11 Drawing Sheets

HALL EFFECT, SHAFT ANGULAR POSITION SENSOR WITH ASYMMETRICAL ROTOR

BACKGROUND OF THE INVENTION

The present invention relates to a Hall effect angular position sensor utilizing DC input power. It is a sensor used to translate a variable angular position of a shaft to a variable DC voltage. The category of DC in./DC out., shaft angular position sensors can be divided into four groups:

1. Potentiometers, where a DC output voltage measured at a moving contact attached to a rotary shaft, will indicate shaft angular position.
2. DC in./DC out. Rotary variable Differential Transformer (RVDT). The RVDT is an AC in./AC out. device, requiring an alternating current input power source, and its output is an AC voltage. Therefore, a DC in./AC out. converter is required for the excitation of the RVDT and an AC in./DC out. converter is required at its output terminals.
3. DC in./DC out. Rotary Variable capacitor. Electronic circuitry similar to those described in item 2 are required.
4. A shaft angular position sensor utilizing a Hall effect device and a shaft mounted permanent magnet. Shaft rotation will cause a change in the magnetic flux flowing through the Hall effect device, causing a DC output, indicative of shaft angular position.

Groups Characteristics.
Group 1.
Advantages: Simple design, low cost.
Disadvantages: Moving contact causing mechanical friction between contact and electrical resistance element, resulting in limited life of the sensor. Susceptibility to vibration damage.
Limited Resolution.
Group 2.
Advantages: No contact between rotor and stator. Excellent resolution.
Disadvantages: Complex design. Expensive sensor.
Group 3.
Same as group 2.
Group 4.
Advantages: Simple design. High reliability. Low cost.
Disadvantages: Permanent magnet may be demagnetized, affecting performance and accuracy of the sensor. Adjustment of output voltage and its linearity versus displacement is difficult. The present inventive device may belong in group 4.

Prior art includes U.S. Pat. No. 4,437,019 March 1984, Jacob Chass, Linear Differential Transformer with Constant Amplitude and Variable Phase Output. It includes slanted primary coils, however, "each of said primary windings are extending about secondary windings forming an alternating voltage transformer". Prior art also includes U.S. Pat. No. 3,491,321 January 1970, Jacob Chass, Rotary Variable Differential Transformer used as a sine-cosine Generator. It includes slanted coils. However, "it includes, in combination, an electrical coil providing transformer primary winding and two pairs of slanted secondary coils, providing alternating currents outputs".

Prior art also includes U.S. Pat. No. 4,766,764, August 1985 William L. Trevillion. Magnetic Freepoint Sensor Utilizing Spaced Hall effect Devices. It includes "coil means for marking the inside of drill pipe or tubing with magnetic marks by passing a DC current pulse through said coil means" (claim 1). The ferromagnetic core disposed within the electrical coil is stationary, and is not disposed within the electrical coil for the purpose of indicating mechanical axial displacement.

The principal object of this invention is to provide a Hall effect, shaft angular position sensor that will not be susceptible to external demagnetization of its magnetic element, its core made of 'soft' ferromagnetic material (not a permanent magnet).

A further object of the invention is to provide a rotary sensor having means for adjusting the magnitude and polarity of its output voltage over its angular displacement range by varying coil excitation current. A still further object of this invention is to provide a Hall effect, shaft angular position sensor which is simple to design, small in size and inexpensive to produce.

SUMMARY OF THE INVENTION

The above and other objectives of the invention are attained by the inventive Hall effect, shaft angular position sensor, comprised of a stator and a rotor assembly. The stator assembly consists of:

1. A housing, comprised of a ferromagnetic shell and two ferromagnetic washers.
2. A bobbin assembly comprised of: a tube made of non-magnetic material and three coil forms made of non-conductive, non-magnetic material.
3. Two coils connected in series opposition.
4. A Hall effect device.

The rotor assembly consists of a core made of 'soft' ferromagnetic material (not a permanent magnet), said core is a sectioned hollow cylinder, and a non-magnetic shaft. The core is rigidly attached to the periphery of the shaft. The rotor assembly is disposed for rotation within the hollow stator.

BRIEF DESCRIPTION OF THE DRAWINGS

The invention may be best understood by reference to the accompanying drawings wherein, like parts in each of the following figures are identified by the same number or character reference, and wherein.

Although the invention has been described with specific reference to two embodiments and modifications thereof, it will be apparent to a knowledgeable person, upon reading this patent, that numerous modifications and alternative materials and arrangements may be devised by those skilled in the art without departing from the spirit and scope of the invention as defined by the appended claims.

DETAILED DESCRIPTION OF THE INVENTION

Figure 1:
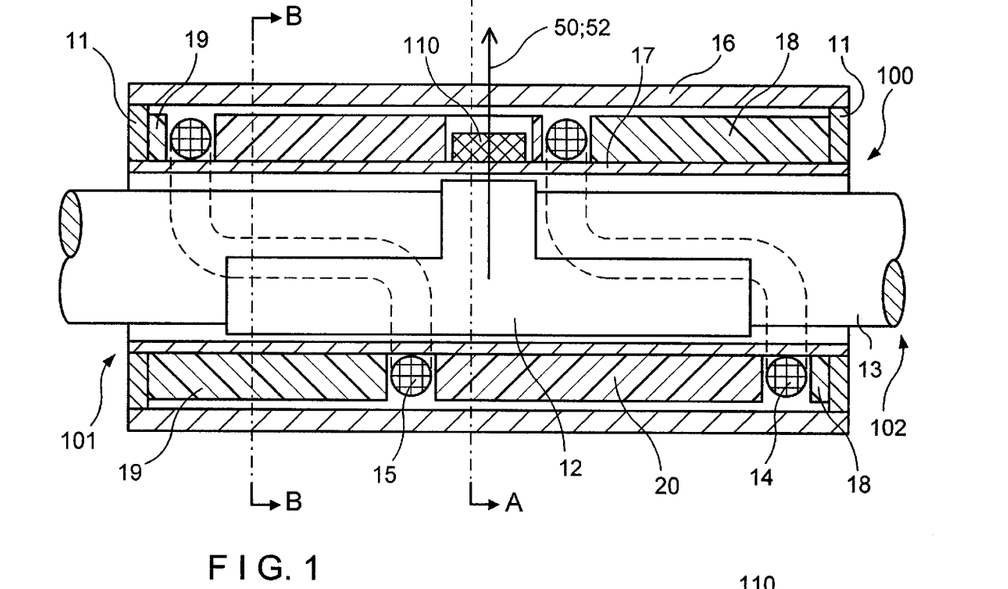
FIG. 1 provides a schematic illustration, in partial section, of the first embodiment of the invention.
Figure 1A:
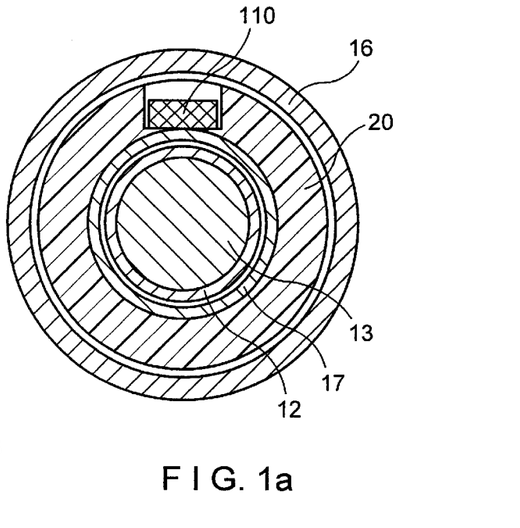
FIG. 1a illustrates side a view of the sensor assembly, in section, along line A—A of FIG. 1, in the direction of the arrows.
Figure 1B:
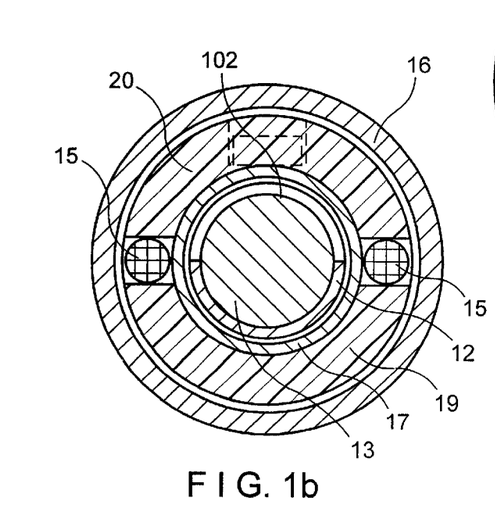
FIG. 1b illustrates side view of the sensor assembly, in section, along line B—B of FIG. 1 in the direction of the arrows.
Figure 2:
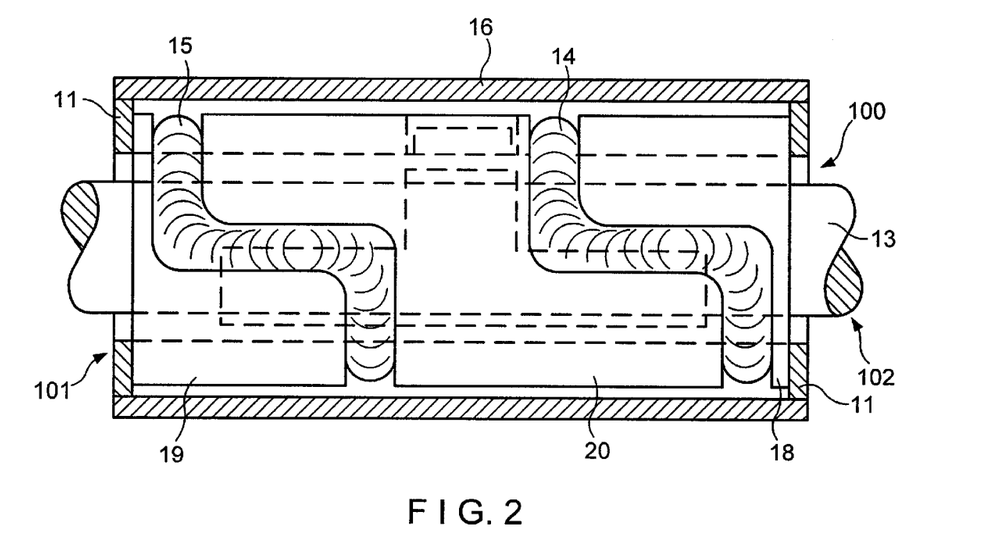
FIG. 2 provides a schematic illustration in partial section of the first embodiment of the invention, with the shell section removed, expounding coils, and coil forms.
Figure 3B:
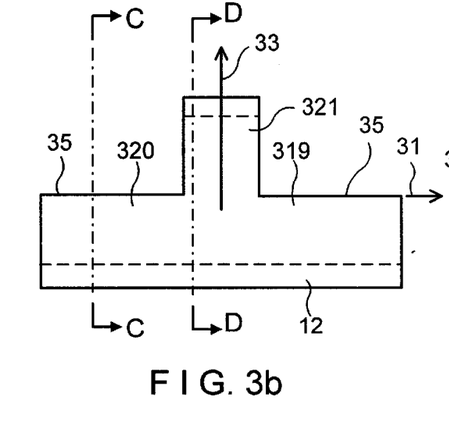
FIG. 3b illustrates side view of core, core axis and axial direction, its radial line of axial symmetry, three axial segments of the core and periphery of two core segments.
Figure 4:
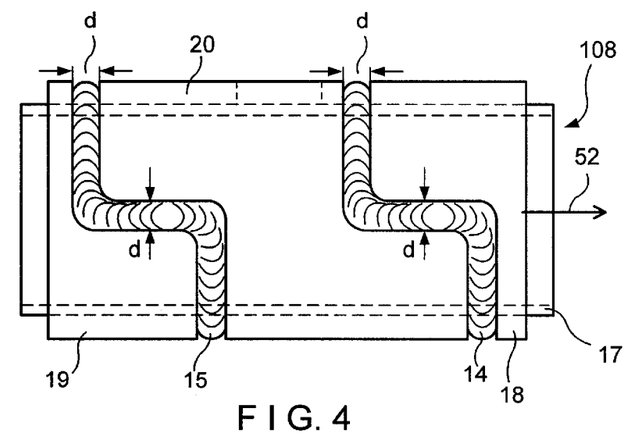
FIG. 4 provides a schematic illustration of the bobbin-winding assembly, utilized in the first embodiment of the invention, showing non-magnetic tube, coil forms, axis, axial direction, two coils and dimension d.
Figure 4A:
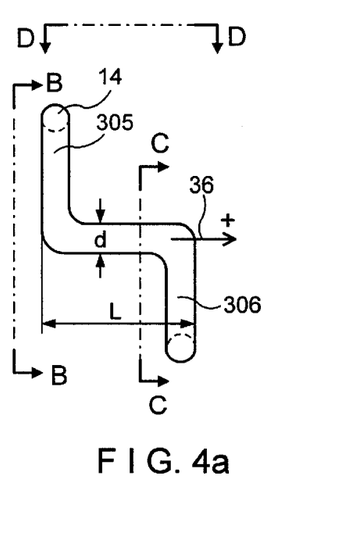
FIG. 4a illustrates side view, axis and positive axial direction of coil; coil axial length and bundle diameter d, and two semicircular segments of coil utilized in the assembly of the first embodiment of the invention.
Figure 4B:
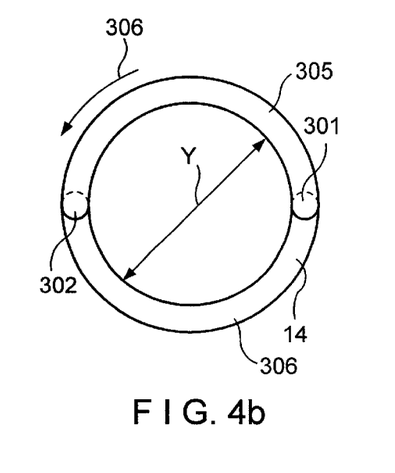
FIG. 4b illustrates front view of coil along line B—B of FIG. 4a in the direction of the arrows, coil diameter, coil semicircular segments and positive direction of coil winding and two winding positions.
Figure 4C:
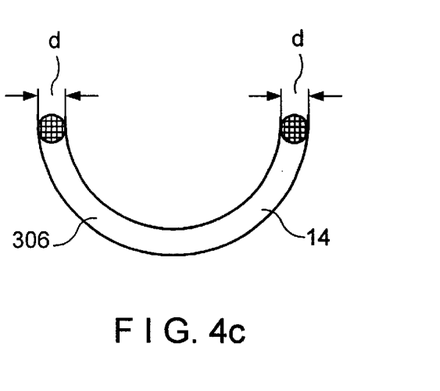
FIG. 4c illustrates front view of coil along line C—C of FIG. 4a in the direction of the arrows, coil semicircular segment and winding cross-section diameter d.
Figure 7:
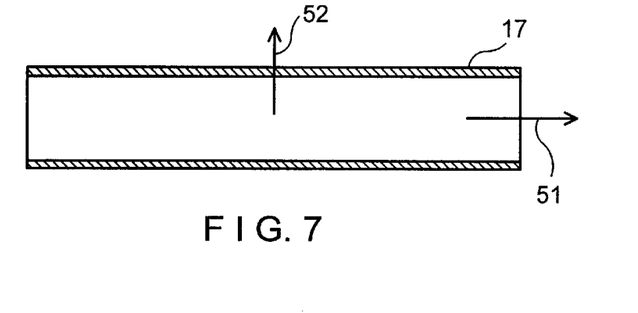
FIG. 7 illustrates side view, in section, of non-magnetic tube, part of the bobbin assembly utilized in the first and second embodiment of the invention. Also illustrated are: tube axis, axial direction and radial line of axial symmetry.
Figure 7A:
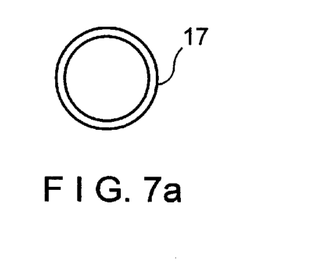
FIG. 7a illustrates front and back view of non-magnetic tube.
Figure 8:
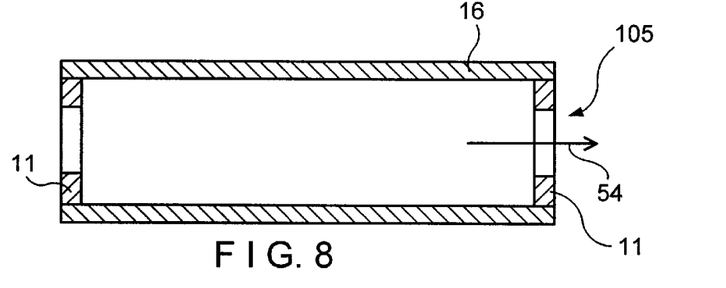
FIG. 8 illustrates side view, in section, of the housing assembly, utilized in the first and second embodiment of the invention showing magnetic shell, magnetic washers, axis and axial direction.
Figure 10:
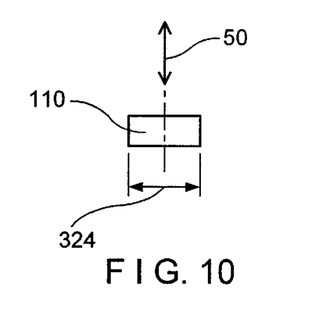
FIG. 10 illustrates side view and dimension, of Hall effect device, magnetic sensing axis and two magnetic flux flow directions.
Figure 10A:
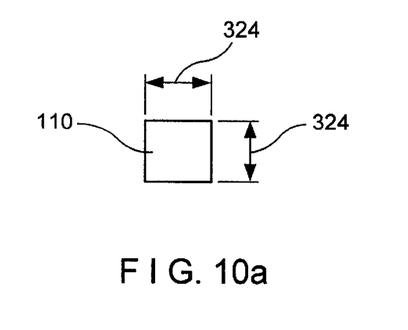
FIG. 10a illustrates top view of Hall effect device and its top dimensions.

A first embodiment of the invention is shown in FIG. 1, FIG. 1a and FIG. 1b. It is a shaft angular position sensor 100 intended for the translation of a shaft angular position into an electrical DC voltage. Principle of operation: The excitation coils 14, (FIG. 4a), and 15 (FIG. 4e) are connected to a DC power source, generating two magnetic flux flows. The power source also provides power to the Hall effect device 110, (FIG. 10). Since magnetic core 12 (FIG. 3b), is asymmetrical along said rotor axis 32, change in the angular position of said core within said coils, relative to stator 101 (FIG. 1) will cause a change in magnitude of said magnetic flux flows. Since said coil 14 and said coil 15 are connected in series opposition, said flux generated by said coil 14 will flow in opposite direction to said flux generated by said coil 15. Said magnetic fluxes will flow through Hall effect device 110, (FIG. 10). The DC output voltage provided by Hall effect device 110, will be a function of the difference between the magnitudes of said magnetic fluxes. Said magnitudes of said magnetic fluxes is determined by angular position of shaft 102 (FIG. 1) relative of stator 101 (FIG. 1). Therefore, said output voltage provided by said Hall effect device is a function of angular shaft 102 position relative to stator 101. The sensor 100, (FIG. 1) is comprised of a stator assembly 101 (FIG. 1) and a rotor assembly 102 (FIG. 1). Said stator assembly is comprised of a hollow bobbin-coil assembly 108 (FIG. 4), Hall effect device 110 (FIG. 10) and magnetic housing assembly 105 (FIG. 8). Bobbin-coil assembly 108 (FIG. 4) is comprised of a non-magnetic tube 17 (FIG. 7), coil form 18 (FIG. 4g), coil form 19 (FIG. 4j), coil form 20 (FIG. 4m). Said coil form 18 is designated as First coil form. Said coil form 20 is designated as Second coil form. Said coil form 19 is designated as Third coil form. Said coil forms are formed of non-conductive, non-magnetic material. Referring to coil form 20, Second coil form. FIG. 4m, illustrates side view, in cross section of said coil form, showing cavity 111, for disposing Hall effect sensor 110; radial line of diagonal symmetry, 42; dimension d/2; alignment indicator 315 for bobbin alignment; axis and axial direction 43. FIG. 4n illustrates front view of coil form 20 showing radial line of symmetry and radial direction 44; angular position of cavity θ=90 degrees of arc; cavity 111 and alignment indicator 315. FIG. 4p illustrates top view of coil form 20 showing cavity 111; cavity top dimensions 311 and alignment indicator 315. Bobbin coil assembly 108 (FIG. 4), includes two coils: coil 14 (FIG. 4a) and coil 15 (FIG. 4e). Said coil 14 is designated First coil. Said coil 15 is designated Second coil. Said coils are wound of insulated, electrically conductive wire; said coils are connected in series opposition.

Figure 4D:
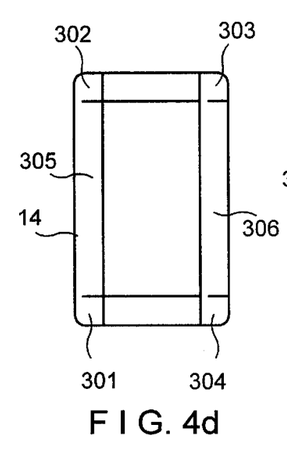
FIG. 4d illustrates top view of coil along line D—D of FIG. 4a in the direction of the arrows, and four winding position and two semicircular segments of coil.
Figures 4E, 4S:
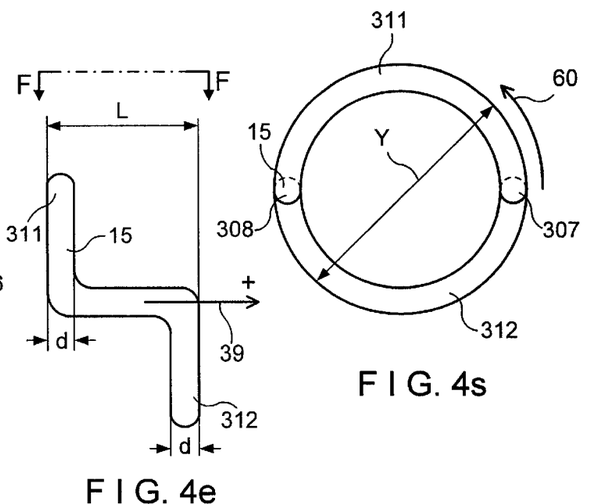
FIG. 4e illustrates side view, axis and positive axial direction of coil, bundle diameter d, coil axial length and two semicircular segments of coil utilized in the assembly of the first embodiment of the invention.
FIG. 4s illustrates front view of coil, positive direction of coil winding.
Figure 4F:
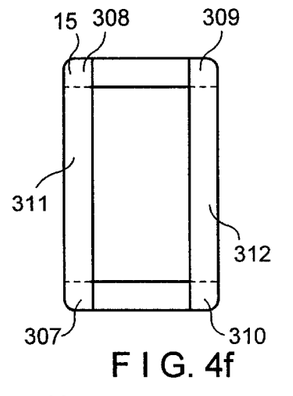
FIG. 4f illustrates top view of coil along line F—F of FIG. 4e in the direction of the arrows, four windings positions, and two semicircular segments of coil.
Figure 4G:
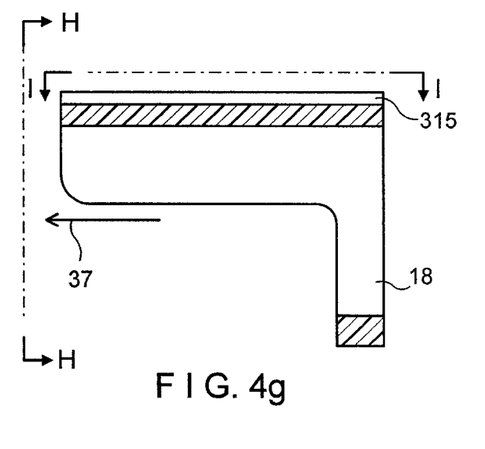
FIG. 4g illustrates side view, in section, of coil form, showing axis, axial direction and alignment indicator.
Figure 4H:
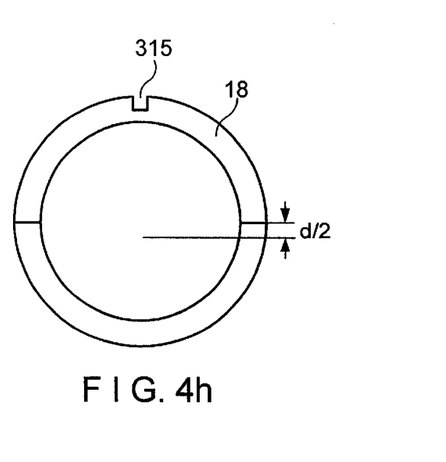
FIG. 4h illustrates front view of coil form along line H—H of FIG. 4g in the direction of the arrows, alignment indicator, and dimension d/2.
Figure 4I:
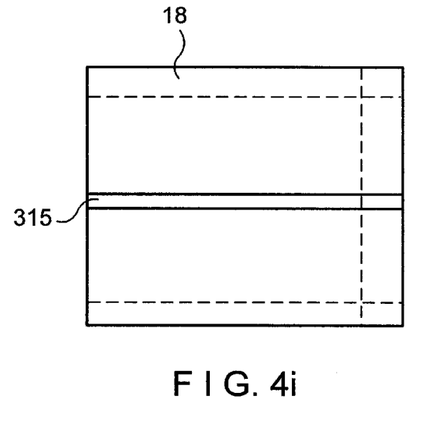
FIG. 4i illustrates top view of coil form along line I—I of FIG. 4g in the direction of the arrows and alignment indicator.
Figure 4J:
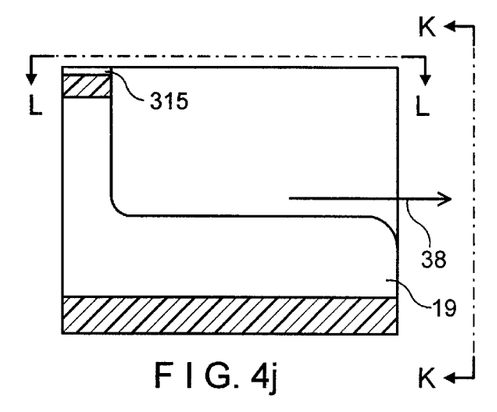
FIG. 4j illustrates side view, in section, of coil form, axis and axial direction, and alignment indicator.
Figure 4K:
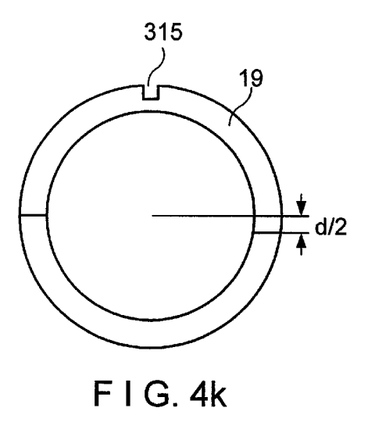
FIG. 4k illustrates front view of coil form along line K—K of FIG. 4j in the direction of the arrows alignment indicator, and dimension d/2.
Figure 4L:
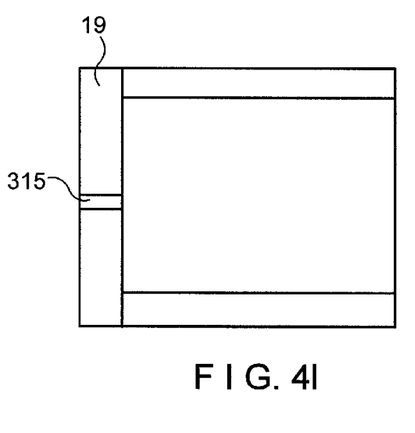
FIG. 4l illustrates top view of coil form along line L—L of FIG. 4j in the direction of the arrows, alignment indicator.
Figure 4M:
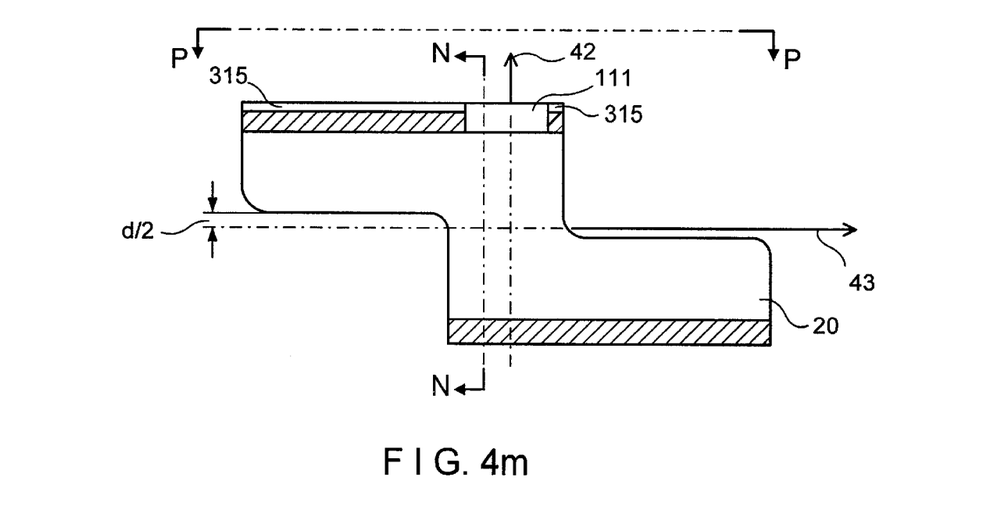
FIG. 4m illustrates side view, in section, of coil form, showing axis, axial direction, radial line of diagonal symmetry, coil form cavity, and alignment indicator, and dimension d/2.
Figure 4N:
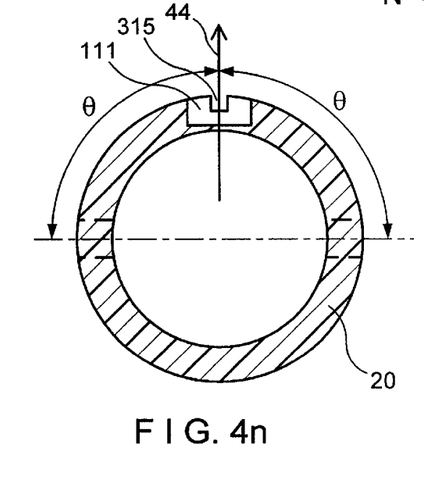
FIG. 4n illustrates front view, in section, of coil form along line N—N of FIGS. 4m and 4p in the direction of the arrows, showing cavity, radial line of symmetry radial direction, angular position of cavity and alignment indicator.
Figure 4P:
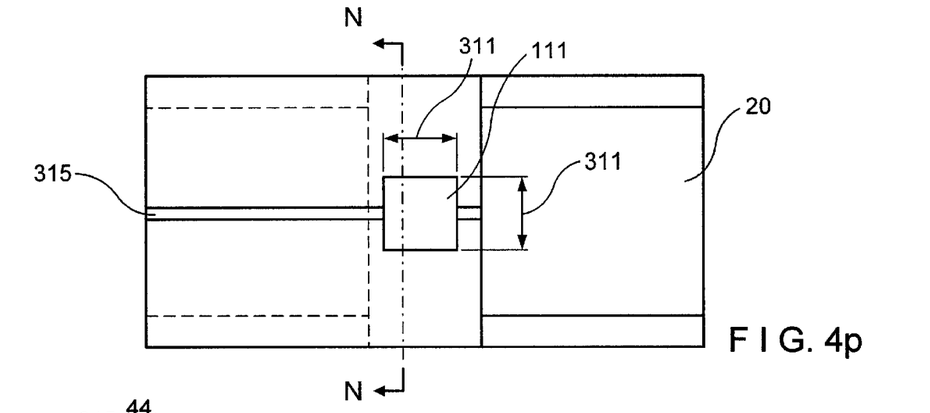
FIG. 4p illustrates top view of coil form along line P—P of FIG. 4m, in the direction of the arrows, showing cavity, cavity dimensions and alignment indicator.
Figure 4Q:
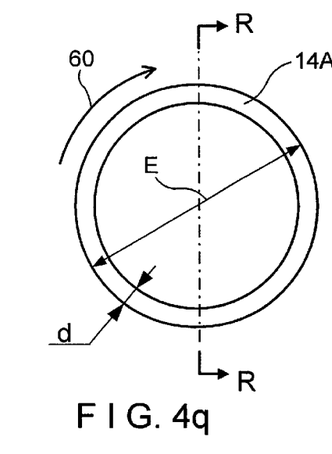
FIG. 4q illustrates front view of circular coil, coil diameter, positive direction of winding and bundle diameter d.
Figure 4R:
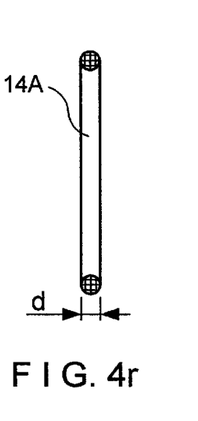
FIG. 4r illustrates side view of coil, in cross-section along line R—R FIG. 4q in the direction of the arrows, and bundle diameter d.
Figure 4T:
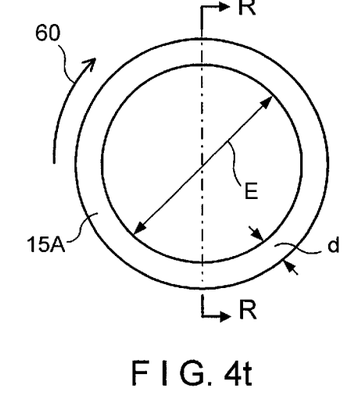
FIG. 4t illustrates front view of circular coil, coil diameter, positive direction of winding and bundle diameter d.
Figure 4U:
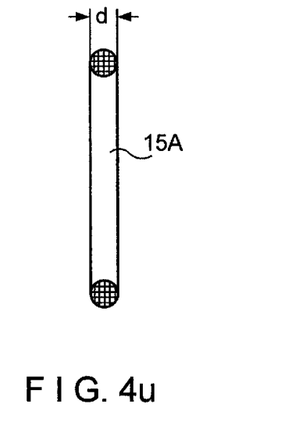
FIG. 4u illustrates side view of coil, in cross-section along line [R—R] U—U of FIG. 4t in the direction of the arrows, and bundle diameter d.

Each of circular coils 14A, 15A shown in FIG. 4q, FIG. 4t is transformed into two semicircular segments conjoined by two axial segments. Said coils front view form a complete circle, FIG. 4b, FIG. 4s. Each said coil is positioned along bobbin axis 56 (FIG. 4) in a dual parallel planes configuration, FIG. 4a and FIG. 4e, said planes perpendicular to bobbin coil assembly axis 56 (FIG. 4). Said corresponding axial segments located on two straight lines, said lines parallel to axis 56 (FIG. 4). The axis and positive direction 36 of coil 14 (FIG. 4a)and the axis and positive direction 39 of coil 15 (FIG. 4e), coincide.

Figure 8A:
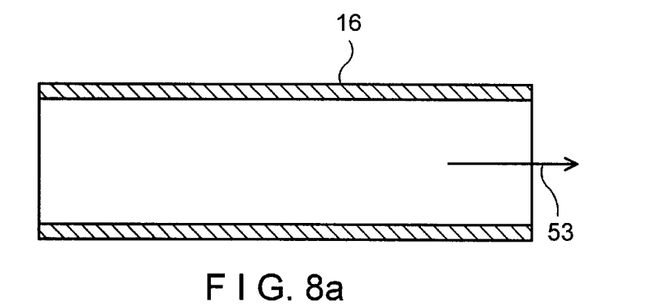
FIG. 8a illustrates side view, in section, the magnetic shell, its axis and axial direction.
Figure 8B:
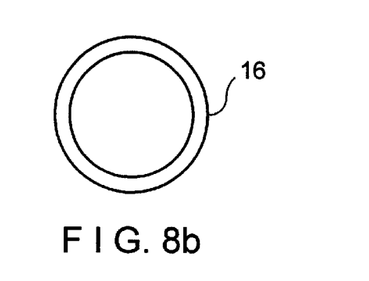
FIG. 8b illustrates front and back view of the magnetic shell.
Figure 8C:
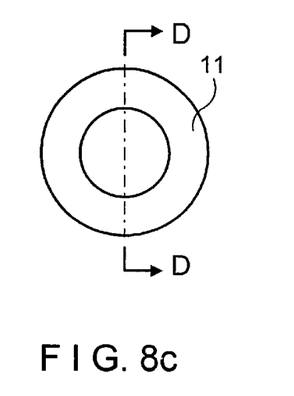
FIG. 8c illustrates front view of the magnetic washers.
Figure 8D:
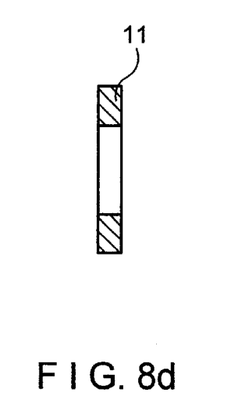
FIG. 8d illustrates side view in section, along the line D—D of FIG. 8c in the direction of the arrows, the magnetic washers.

Housing assembly 105 (FIG. 8) is comprised of magnetic shell 16 (FIG. 8a), and two magnetic washers 11 (FIG. 8c).

Figure 3:
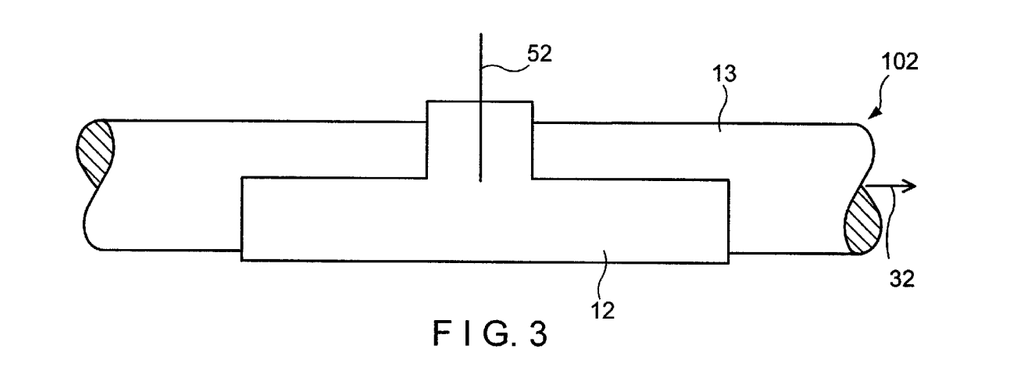
FIG. 3 illustrates side view of rotor assembly, utilized in the first and second embodiment of the invention, showing shaft, magnetic core, shaft axis and axial direction, and radial line of axial symmetry.
Figure 3A:
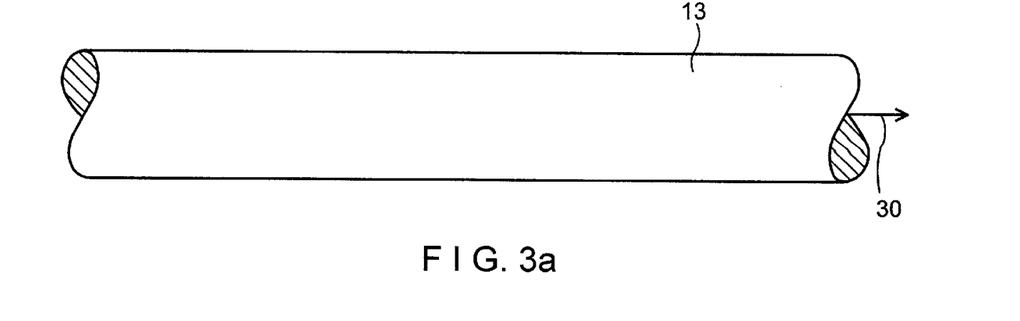
FIG. 3a illustrates side view of shaft, showing shaft axis, and axial direction.

The rotor assembly 102 (FIG. 3) is comprised of shaft 13 (FIG. 3a), made of non-magnetic material, and core 12, (FIG. 3b), made of 'soft' ferromagnetic material (not a permanent magnet material). Magnetic core 12 is rigidly secured to the periphery of shaft 13 (FIG. 3). Axis 31 of core 12 and axis 30 of shaft 13, coincide.

Core 12 (FIG. 3b) is a hollow cylinder sectioned by flat plane 35 (FIG. 3c) in two places, along axis 31 into three core segments: 319, 320 and 321.

Figure 3C:
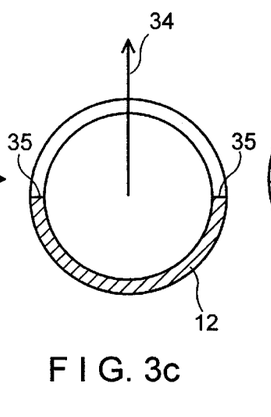
FIG. 3c illustrates front view of core, in section, along line C—C of FIG. 3b in the direction of the arrows, radial line of symmetry, perpendicular to intersecting plane, said plane and said core axis coincide.
Figure 3D:
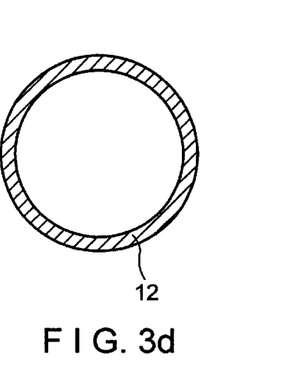
FIG. 3d illustrates front view of core, in section, along line D—D of FIG. 3b in the direction of the arrows.

Segments 319 and 320 are substantially equivalent to each other, and are partially sectioned cylinder. Segment 321 is an intact cylinder. Axial length of segment 321 is approximately equal to dimension 324 of Hall effect device 110 (FIG. 10). Line 33 (FIG. 3b) is the radial line of axial symmetry of core 12 (FIG. 3b). Radial position, radial direction, and axis of radial symmetry of core 12 are delineated by line 34 (FIG. 3c). Line 34 is also perpendicular to plane 35 (FIG. 3c). Referring back to bobbin assembly 108 (FIG. 4). Coil form 20 (FIG. 4m) is secured to the periphery of non-magnetic tube 17 (FIG. 7). Radial line of axial symmetry 52 of tube 17 (FIG. 7) and radial line of diagonal symmetry 42 of coil form 20 (FIG. 4m) coincide. Also axis 51 of tube 17, and axis 43 of coil form 20, coincide. Referring back to coil assembly shown in FIG. 4. The length of one complete turn of coil 14 (FIG. 4a, 4b) is: π×Y+2×L, where Y is the diameter of coil 14 (FIG. 4b), and L is coil 14 axial length (FIG. 4a). Circular coil 14A (FIG. 4q) is wound in positive direction 60 of insulated, electrically conductive wire. Circumference of coil 14A is π×E, where E is the diameter of coil 14A (FIG. 4q). Also axial dimension of coil 14A (FIG. 4r) is d. Formation of coil 14A to coil 14 requires: π×E=π×Y+2×L, or E=Y+2×L/π. Circular coil 14A is disposed about tube 17 (FIG. 7). Coil form 18 (FIG. 4g) is disposed about tube 17 in direction 37 (FIG. 4g). Alignment indicator 315 of coil form 20 and alignment indicator 315 of coil form 18, form one straight line. Coil form 18 is displaced in axial direction 37 (FIG. 4g) to dimension d (FIG. 4). Then, coil form 18 is rigidly secured to the periphery of tube 17. Consequently, coil 14A is transformed to coil 14.

Referring back to first coil 14 (FIG. 4d). Said coil is comprised of two semicircular segments, 305 and 306, and two straight segments (FIG. 4d). Joint 301 is designated First position; joint 302 is designated Second position; joint 303 is designated Third position; joint 304 is designated Fourth position, said positions are the locations where said coil semicircular segments are conjoined to said straight coil segments. Semicircular segment 305 is designated First segment. Semicircular segment 306 is designated Second segment.

Referring to coil 15 (FIG. 4e). Coil 15 is substantially identical to coil 14 (FIG. 4a), therefore formation of coil 15A (FIG. 4t) to coil 15 (FIG. 4e) is the same as the formation of coil 14A (FIG. 4q) to coil 14 (FIG. 4a).

FIG. 4s illustrates positive direction 60, of winding of coil 15.

Circular coil 15A is disposed about tube 17 (FIG. 7). Coil form 19 (FIG. 4j) is disposed about tube 17 in direction 38 (FIG. 4j). Alignment indicator 315 of coil form 20, and alignment indicator 315 of coil form 19, form one straight line. Coil form 19 is displaced in axial direction 38 (FIG. 4j)

to dimension d (FIG. 4),. Then coil form 19 is rigidly secured to the periphery of tube 17. Consequently, coil 15A is transformed to coil 15.

Referring back to Second coil 15 (FIG. 4f). Said coil is comprised of two semicircular segments, 311 and 312, and two straight segments. Joint 307 is designated Fifth position; Joint 308 is designated Sixth position; Joint 309 is designated Seventh position; Joint 310 is designated Eighth position. Said positions are the locations where said coil semicircular segments are conjoined to said straight segments (FIG. 4f). Semicircular segment 311 is designated Third segment; Semicircular segment 312 is designated Fourth segment (FIG. 4e). Assembly 108 (FIG. 4) is rigidly disposed within housing assembly 105 (FIG. 8) and secured. Axis and axial direction 52 (FIG. 4) as and axial direction 54 (FIG. 8) coincide, forming stator assembly 101 (FIG. 1).

Shaft assembly 102 (FIG. 3) is disposed for rotation within the hollow stator forming a Hall effect, shaft angular position sensor 100 (FIG. 1). Axis and axial direction 52 (FIG. 4), axis and axial direction 32 (FIG. 3), coincide.

In operation, input power (DC) is applied to the series connected coil 14 (FIG. 4a) and coil 15 (FIG. 4e). Power input is accomplished by connecting one end of coil 14 with one end of coil 15 and then applying power to the two remaining ends of the coils. Input power is also applied to Hall effect device 110 (FIG. 10), shown in assembly 100 (FIG. 1). The direct current applied to said coil will generate two magnetic flux flows. Since said coils are connected in series opposition, flow directions of said magnetic flux flows will be reversed to each other. Magnetic flux flow generated by coil 14 (FIG. 1) is designated First Flow; magnetic flux flow generated by coil 15 (FIG. 1) is designated Second Flow.

Figure 9:
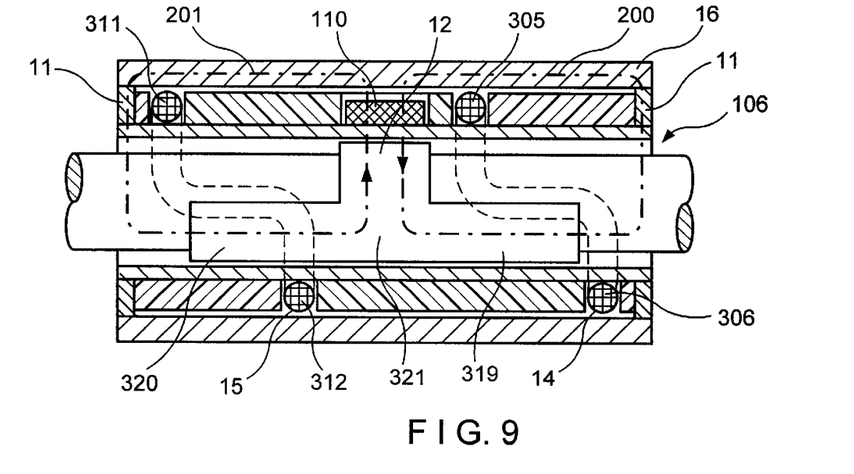
FIG. 9 illustrates side view, in section, of the first embodiment of the invention, showing two magnetic circuits, two coils, four coil segments, core, three core segments, magnetic shell and washers, and Hall effect device relationship to the said magnetic circuits.

Referring to FIG. 9, two magnetic circuits are illustrated: Magnetic circuit 200, which includes core segment 319, core segment 321, Hall effect device 110, magnetic shell 16, magnetic washer 11 and back to core segment 319. At angular shaft position shown,(FIG. 9), core segment 319 is not encircled by semicircular coil segments 305 and 306 of coil 14 (FIG. 4a), therefore, the magnitude of said First flux flow through magnetic circuit 200 will be low. Magnetic circuit 201, which includes core segment 320, core segment 321, Hall effect device 110, magnetic shell 16, magnetic washer 11 and back to core segment 320. At angular position shown, in FIG. 9, referred to shaft angular position of zero degrees of arc, core segment 320 is entirely encircled by semicircular coil segment 312 of coil 15 (FIG. 4). Therefore, the magnitude of said Second flux flow through magnetic circuit 201 will be high. The magnitude of voltage generated by the Hall effect device and its polarity is a function of the magnitude and flow direction of the magnetic flux flow through axis 50 of Hall effect device 110 (FIG. 10). Since the direction of First flux flow is reversed to the direction of Second flux flow, said generated magnitude of output voltage will be a function of the difference between said First flux flow and said Second flux flow. At angular shaft position shown (FIG. 9, FIG. 1), said sensor output voltage will be at its maximum, and polarity of said output voltage is designated as positive.

Figure 9A:
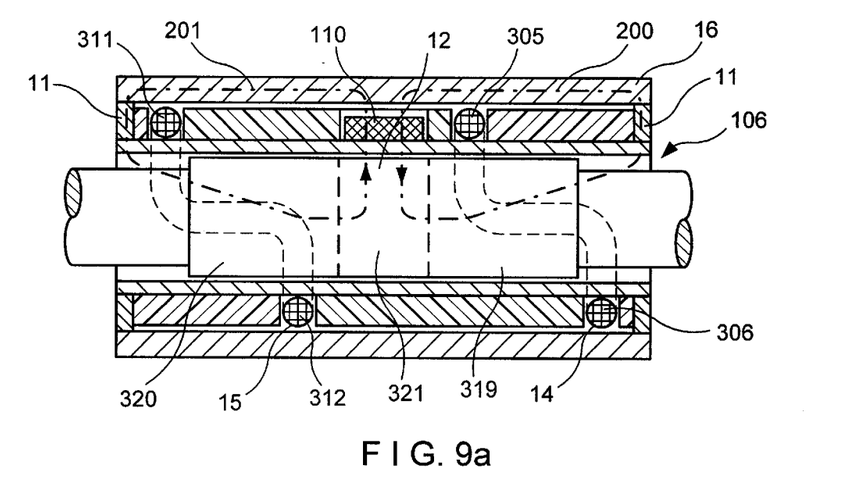
FIG. 9a illustrates core angular position displaced 90 degrees of arc, from its position as illustrated in FIG. 9.

Referring to FIG. 9a FIG. 9a illustrates sensor 106 in partial section, showing magnetic circuit 200 and magnetic circuit 201. The sensor shown in FIG. 9 was converted to the sensor shown in FIG. 9a by rotating the core, 90 degrees of arc. Semicircular coil segment 306 (FIG. 4a) of said First coil encircles one half of core segment 319 (FIG. 9a, 3b). Semicircular coil segment 312 (FIG. 4e) of said Second coil encircles one half of core segment 320 (FIG. 9a, 3b). Therefore, the magnitude of said magnetic flux flowing in magnetic circuit 200 will be equal to the magnitude of said magnetic flux flow flowing in magnetic circuit 201. Since said magnetic fluxes are reversed in direction, the total said magnetic flux flowing through Hall effect device 110 (FIG. 9a) will be zero, and the magnitude of said output voltage generated by Hall effect device 110 (FIG. 9a), will be zero. Said shaft angular position for said zero output voltage is designated shaft null position.

Referring back to FIG. 9, a shaft angular displacement of 180 degrees of arc form angular shaft position shown, will cause semicircular coil segment 306 (FIGS. 9, 4a) of First coil to encircle core section 319 (FIGS. 9, 3b), and core segment 320 (FIGS. 9, 3b) will not be encircled by Second coil. Therefore, magnitude of said voltage generated by said Hall effect device 110, will be at its maximum, the same as said output voltage measured at said zero degrees of arc position. However, said polarity of said output voltage measured at said shaft position of 180 degrees of arc will be reversed in polarity to said output voltage measured at said core position of zero degrees of arc. Said polarity of said output voltage is designated negative.

Referring back to FIG. 9a. An angular shaft rotation of 180 degrees of arc will produce two flux flows equal in magnitude and reversed in direction flowing through Hall effect device 110, resulting in zero output voltage generated by Hall effect device 110, producing a second null position.

Figure 5:
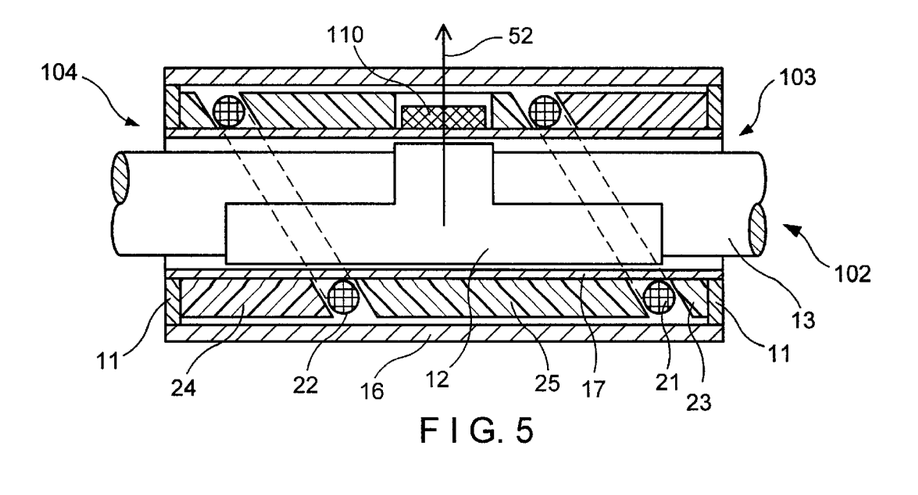
FIG. 5 provides a schematic illustration, in partial section, the second embodiment of the invention, with shell section removed, expounding two coils and coil forms.

A second embodiment of the invention is shown in FIG. 5. It is a Hall effect, shaft angular position sensor 103, comprised of a stator assembly 104 and a rotor assembly 102. Shaft assembly 102 (FIG. 3), housing assembly 105 (FIG. 8). Hall effect device 110 (FIG. 10) are utilized in sensor 103 (FIG. 5) and in sensor 100 (FIG. 1). Also, principle of operation of sensor 103 (FIG. 5) is the same as said principle of operation of sensor 100 (FIG. 1). Referring to bobbin-coil assembly 109 (FIG. 6) utilized in the second embodiment of the invention. Said bobbin-coil assembly is comprised of a non-magnetic tube 17 (FIG. 7), Fourth coil form 23 (FIG. 6i), Fifth coil form 25 (FIG. 6m) Sixth coil form 24 (FIG. 6k), Third coil 21 (FIG. 6c, 6v), and Fourth coil 22 (FIG. 6c, 6, 6v), and Hall effect device 110 (FIG. 10). Said coil forms are made of non-conductive, non-magnetic material. Referring to coil form 25, Fifth coil form. FIG. 6m, illustrates side view, in cross section of said coil form showing cavity 111, for disposing Hall effect sensor 110; radial line of diagonal symmetry 47; slant angle φ degrees of arc; alignment indicator 315 for bobbin alignment; axis axial direction 46. FIG. 6n illustrates front view of said coil form showing radial line of symmetry and radial direction 48; angular position of cavity Φ=90 degrees of arc; cavity 111 and alignment indicator 315.

Said coils are wound of insulated, electrically conductive wire, said coils are positioned along bobbin 109 axis 55 (FIG. 6), in parallel, at slanted angle φ position; said coils are connected in series opposition. Said Hall effect device 110 (FIG. 10) is disposed about cavity 111 in Fifth coil form 25 (FIG. 6m). Axis 50 of Hall effect device 110, and radial line of diagonal symmetry 47 of coil form 25 (FIG. 6m), coincide. Axis of Hall effect device 50, and radial line of symmetry 48 of coil form 25 (FIG. 6n) coincide.

Assembly procedure of said bobbin-winding assembly, is identical to assembly procedure of bobbin-coil assembly 108 (FIG. 4), utilized in the first embodiment of the invention. Coil forms and coils are different in shape from coils and coil forms utilized in the first embodiment of the invention.

Figure 6:
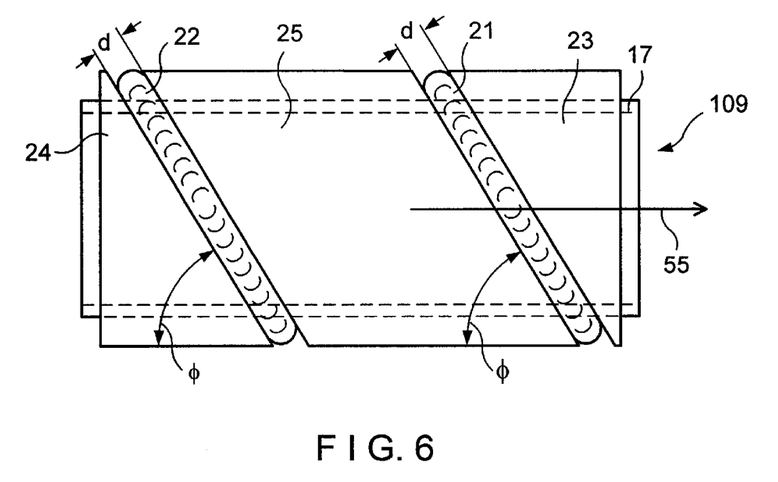
FIG. 6 provides schematic illustration, in side view of bobbin-winding assembly, utilized in the second embodiment of the invention, showing non-magnetic tube, coil forms, coils, slant angle, and dimension d, axis and axial direction.
Figure 6A:
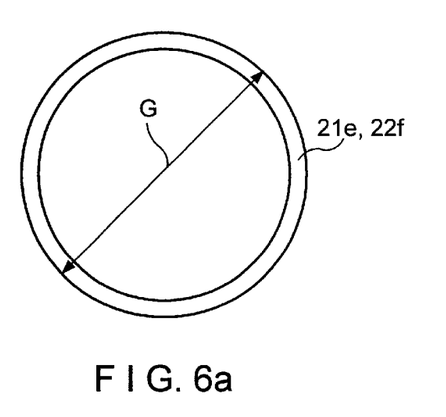
FIG. 6a illustrates front view and diameter of circular coil utilized in the second embodiment of the invention.
Figure 6B:
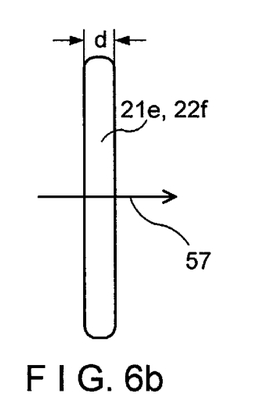
FIG. 6b illustrates side view of coil, coil axis, and axial dimension d.
Figure 6C:
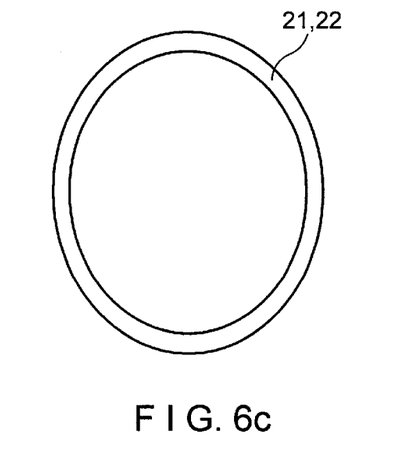
FIG. 6c illustrates front view of oval coil.
Figure 6I:
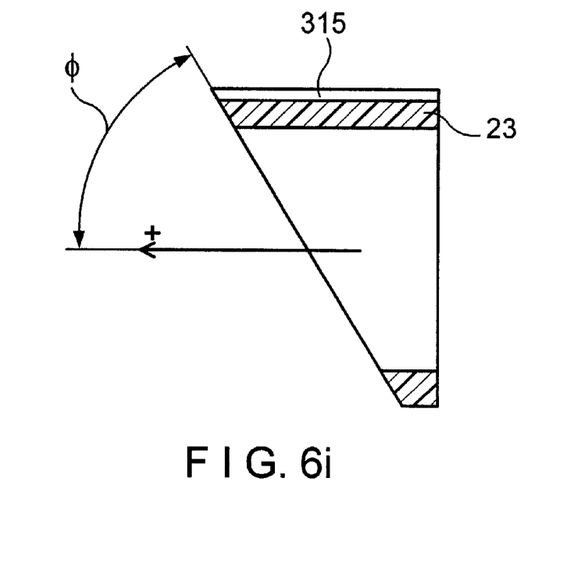
FIG. 6i illustrates side view, in section, of coil form, axis and axial direction, alignment indicator and coil form slant angle.
Figure 6J:
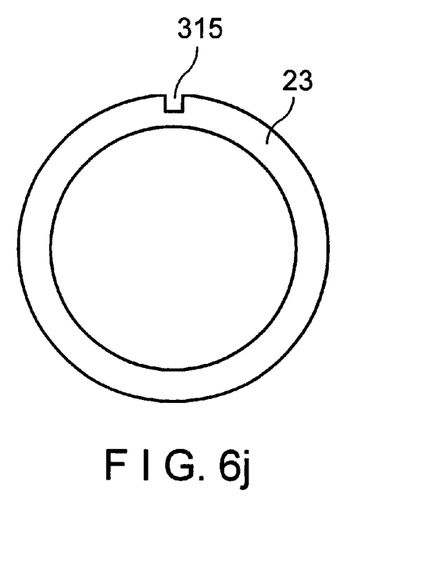
FIG. 6j illustrates front and back view of coil form, and alignment indicator.
Figure 6K:
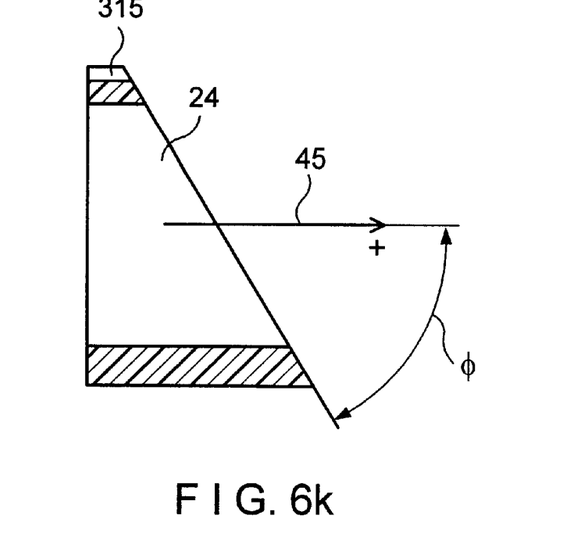
FIG. 6k illustrates side view, in section, of coil form, axis and axial direction, alignment indicator and coil form slant angle.
Figure 6L:
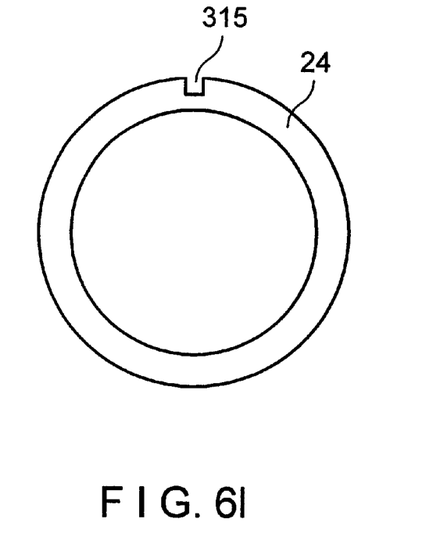
FIG. 6l illustrates front and back view of coil form and alignment indicator.
Figure 6M:
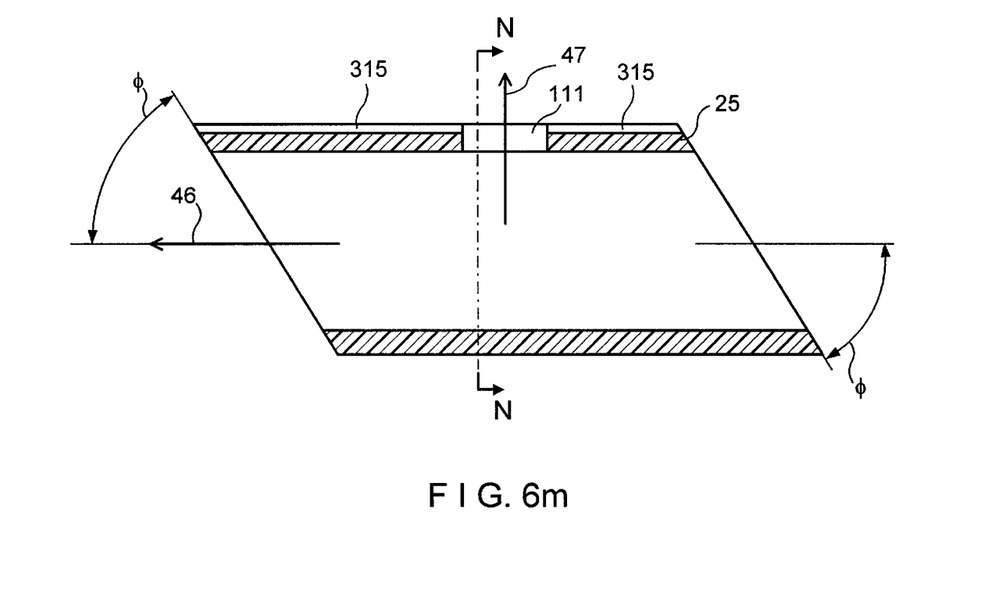
FIG. 6m illustrates side view, in section, of coil form, showing axis and axial direction, radial line of diagonal symmetry, coil form cavity, alignment indicator, and coil form slant angles.
Figure 6N:
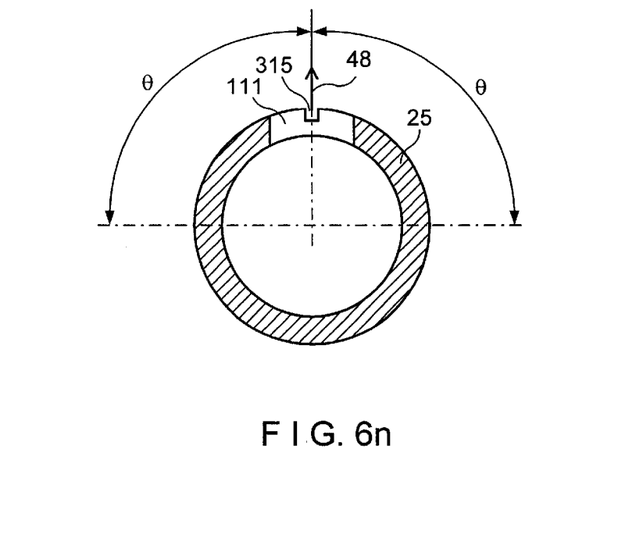
FIG. 6n illustrates coil form front view, in section, along line N—N of FIG. 6m, in the direction of the arrows, showing cavity, cavity dimension, alignment indicator, line of radial symmetry, and radial position of cavity.

Referring to coils 21 and 22 (FIG. 6c), and (FIG. 6v). Said coils were transformed from circular coils 21e and 22f (FIG. 6a) to an oval form as shown in FIG. 6c, when installed in bobbin assembly as shown in FIG. 6. Said transformation process is the same as described in said assembly procedure of said bobbin-coil assembly of the first embodiment of the invention. Referring back to circular coils 21e and 22f (FIG. 6a). circumference of said coils is $\pi \times G$, where G is the diameter of said coils. The length of one turn of coil 21 and coil 22 (FIG. 6c) is designated as I, which is, substantially, the perimeter of an ellipse. Therefore, $I=\pi \times G$; and $G =I/\pi$. G is the diameter of circular coils 21e and 22f (FIG. 6a); FIG. 6b illustrate side view of coils 21e and 22f. Axial dimension of said coils is d.

Assembly 109 (FIG. 6) is disposed within housing assembly 105 (FIG. 8) and rigidly secured. Axis and axial direction 55 (FIG. 6), axis and axial direction 54 (FIG. 8) coincide, forming stator assembly 104 (FIG. 5). Shaft assembly 102 is disposed for rotation within the hollow stator. Axis and axial direction 55 (FIG. 6), axis and axial direction 32 (FIG. 3), coincide, forming Hall effect, shaft angular position sensor 103 (FIG. 5).

In operation, Hall effect, shaft angular position sensor 103 (FIG. 5), is substantially the same as operation of said sensor 100 (FIG. 1).

What is claimed is:

1. A Hall effect, shaft angular position sensor comprised of a housing, said housing including a shell having open ends and two washers, one disposed at each end of said shell, at least partially closing said open ends; a hollow cylindrical bobbin made of non-magnetic material, said bobbin rigidly disposed within said housing, axis of said bobbin and axis of said housing substantially coincide; at least one energizing electrical coil wound of insulated electrically conductive wire, said coil disposed about said bobbin, said coil lying in a plane which intersects said axis of said bobbin at an angle other than 90 degrees of arc, said energizing electrical coil providing magnetic flux flow; at least one Hall effect device supported within said shell and disposed about said coil, magnetic sensing axis of said Hall effect device substantially perpendicular to said bobbin axis, said Hall effect device magnetic sensing axis intersects said bobbin axis at a location other than said intersection point of said plane and said bobbin axis; a ferromagnetic rotor member, centrally retained within said hollow cylindrical bobbin, axis of said rotor and axis of said bobbin substantially coincide, said rotor member being asymmetrical along said rotor axis, so that an angular displacement of said rotor member about said rotor axis will vary the magnitude of said magnetic flux flow through said Hall effect device.

2. The invention in accordance with claim 1 wherein said plane is flat.

3. The invention in accordance with claim 1 wherein said housing is made ferromagnetic material.

4. The invention in accordance with claim 1, wherein said housing is made of ferromagnetic material and said plane is flat.

5. A Hall effect, shaft angular position sensor comprised of: a housing, said housing including a shell having open ends and two washers, one disposed at each end of said shell, at least partially closing said open ends; a hollow cylindrical bobbin made of non-magnetic material, said bobbin rigidly disposed within said housing, axis of said bobbin and axis of said housing substantially coincide; two energizing electrical coils wound of insulated, electrically conductive wire, said coils connected in series opposition relationship, said two coils laying in two spaced parallel, substantial identical, planes intersect said axis of said bobbin at an angle other than 90 degrees of arc, said energizing electrical coils provide magnetic flux flow; at least one Hall effect device supported within said shell and disposed about said space between said parallel planes, magnetic sensing axis of said Hall effect device substantially perpendicular to said bobbin axis, said Hall effect device magnetic sensing axis, bobbin radial line of symmetry, and bobbin radial line of diagonal symmetry, substantially coincide; a ferromagnetic rotor member centrally retained within said hollow cylindrical bobbin, axis of said rotor and axis of said bobbin substantially coincide, said rotor member being asymmetrical along said rotor axis, so that an angular displacement of said rotor member about said rotor axis will vary the magnitude of said magnetic flux flow through said Hall effect device.

6. The invention in accordance with claim 5 wherein said two planes are flat, and said housing is made of ferromagnetic material.

7. The invention of claim 5 wherein the number of turns of said electrical coils are substantially equal, and said housing made of ferromagnetic material.

8. The invention of claim 6 wherein the number of turns of said electrical coils are substantially equal.

9. The invention of claim 5 wherein said housing is made of ferromagnetic material.

10. A Hall effect, shaft angular position sensor comprised of: a housing, said housing including a shell having open ends and two washers, one disposed at each end of said shell, at least partially closing said open ends; a hollow cylindrical bobbin made of non-magnetic material, said bobbin rigidly disposed within said housing; axis of said bobbin and axis of said housing substantially coincide; First and Second energizing electrical coils wound of insulated, electrically conductive wire, said coils are connected in series opposition relationship, said coils are spaced and disposed about said bobbin, said First coil is wound from First position circumferentially about said bobbin in a positive winding direction substantially 180 degrees of arc to Second position, and thereafter in positive axial direction to Third position and thereafter, circumferentially about said bobbin in a positive winding direction substantially 180 degrees of arc to Fourth position and thereafter in a negative axial direction along said bobbin to First position; said Second coil is wound from Fifth position circumferentially about said bobbin in a positive winding direction substantially 180 degrees of arc to Sixth position, and thereafter, in positive axial direction to Seventh position and thereafter, circumferentially, about said bobbin in a positive winding direction substantially 180 degrees of arc to Eighth position and thereafter in a negative axial direction along said bobbin to Fifth position; said First position, Fourth position, Fifth position and Eighth position are all on a common, straight line, said line substantially parallel to axis of said bobbin, said Second position, Third position, Sixth position and Seventh position are all on a common straight line, said line is substantially parallel to axis of said bobbin; said energizing electrical coils provide magnetic flux flow; at least one Hall effect device supported within said shell disposed about said space between said First coil and said Second coil, magnetic sensing axis of said Hall effect device substantially perpendicular to said bobbin axis, said Hall effect device magnetic sensing axis, bobbin radial line of symmetry and bobbin radial line of diagonal symmetry substantially coincide; a ferromagnetic rotor member centrally retained within said hollow cylindrical bobbin, axis of said rotor and axis of said bobbin substantially coincide, said rotor member being asymmetrical along said rotor axis, so that an angular displacement of said rotor member about said rotor axis will vary the magnitude of said magnetic flux flow through said Hall effect device, said rotor extending longitudinally from an axial position short of said First position to an axial position short of said Eighth position.

11. The invention in accordance with claim 10, wherein said housing is made of ferromagnetic material.

12. The invention of claim 10 wherein the number of turns of said First electrical coils and said Second electrical coil are substantially equal, and said housing is made of ferromagnetic material.

13. The invention of claim 10 wherein the number of turns of said First electrical coils and said Second electrical coil are substantially equal.

14. A Hall effect, shaft angular position sensor comprised of a housing, said housing including a shell having open ends and two washers, one disposed at each end of said shell, at least partially closing said open ends; a hollow cylindrical bobbin made of non-magnetic material, said bobbin rigidly disposed within said housing; axis of said bobbin and axis of said housing substantially coincide; First and Second energizing electrical coils wound of insulated, electrically conductive wire, said coils are connected in series opposition relationship, said coils are spaced and disposed about said bobbin, said First coil is wound from First position circumferentially about said bobbin in a positive winding direction substantially 180 degrees of arc to Second position, and thereafter in positive axial direction to Third position and thereafter, circumferentially about said bobbin in a positive winding direction substantially 180 degrees of arc to Fourth position and thereafter in a negative axial direction along said bobbin to First position; said Second coil is wound from Fifth position circumferentially about said bobbin in a positive winding direction substantially 180 degrees of arc to Sixth position, and thereafter, in positive axial direction to Seventh position and thereafter, circumferentially, about said bobbin in a positive winding direction substantially 180 degrees of arc to Eighth position and thereafter in a negative axial direction along said bobbin to Fifth position; said First position, Fourth position, Fifth position and Eighth position are all on a common, straight line, said line substantially parallel to axis of said bobbin, said Second position, Third position, Sixth position and Seventh position are all on a common straight line, said line is substantially parallel to axis of said bobbin; said length of a straight line segment joining said Second position to said Third position is equal to the length of a straight line segment joining said Fourth position and said First position, and wherein the length of a straight line segment joining said Second position to said Third position is equal to the length of a straight line segment joining said sixth position to said Seventh position and wherein the length of a straight line segment joining said Sixth position to said Seventh position is equal to the length of a straight line segment joining said Eighth position to said Fifth position; said energizing electrical coils provide magnetic flux flow; at least one Hall effect device supported within said shell disposed about said space between said First coil and said Second coil, magnetic sensing axis of said Hall effect device substantially perpendicular to said bobbin axis, said Hall effect device magnetic sensing axis, bobbin radial line of symmetry and bobbin radial line of diagonal symmetry substantially coincide; a ferromagnetic rotor member centrally retained within said hollow cylindrical bobbin, axis of said rotor and axis of said bobbin substantially coincide, said rotor member being asymmetrical along said rotor axis, so that an angular displacement of said rotor member about said rotor axis will vary the magnitude of said magnetic flux flow through said Hall effect device, said rotor extending longitudinally from an axial position short of said First position to an axial position short of said Eighth position.

15. The invention in accordance to claim 14 wherein said housing is made of ferromagnetic material.

16. The invention in accordance to claim 14 wherein the number of turns of said First electrical coil and said Second electrical coil are substantially equal, and said housing is made of ferromagnetic material.

17. The invention in accordance to claim 14 wherein the number of turns of said First electrical coil and said Second electrical coil are substantially equal.

* * * * *